United States Patent
Jeong

(10) Patent No.: US 10,445,172 B2
(45) Date of Patent: Oct. 15, 2019

(54) SEMICONDUCTOR DEVICE AND OPERATING METHOD THEREOF

(71) Applicant: SK hynix Inc., Gyeonggi-do (KR)

(72) Inventor: Ha-Jun Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 166 days.

(21) Appl. No.: 15/787,800

(22) Filed: Oct. 19, 2017

(65) Prior Publication Data

US 2018/0165149 A1 Jun. 14, 2018

(30) Foreign Application Priority Data

Dec. 13, 2016 (KR) .................. 10-2016-0169218

(51) Int. Cl.
| | | |
|---|---|---|
| *G06F 11/10* | (2006.01) | |
| *G11C 7/10* | (2006.01) | |
| *G11C 11/4076* | (2006.01) | |
| *G11C 11/4096* | (2006.01) | |
| *G11C 29/02* | (2006.01) | |
| *G11C 29/52* | (2006.01) | |
| *G11C 29/04* | (2006.01) | |
| *G11C 11/4097* | (2006.01) | |

(52) U.S. Cl.
CPC ........ *G06F 11/1004* (2013.01); *G11C 7/1018* (2013.01); *G11C 7/1087* (2013.01); *G11C 11/4076* (2013.01); *G11C 11/4096* (2013.01); *G11C 7/1006* (2013.01); *G11C 11/4097* (2013.01); *G11C 29/021* (2013.01); *G11C 29/023* (2013.01); *G11C 29/52* (2013.01); *G11C 2029/0409* (2013.01)

(58) Field of Classification Search
CPC .............. G06F 11/1004; G11C 7/1018; G11C 7/1087; G11C 11/4076; G11C 11/4096; G11C 7/1006; G11C 11/4097; G11C 29/021; G11C 29/023; G11C 29/52; G11C 2029/0409
USPC ....... 714/807, 731, 732, 746, 753, 768, 773, 714/800, 801
See application file for complete search history.

(56) References Cited

U.S. PATENT DOCUMENTS

| | | | | |
|---|---|---|---|---|
| 9,324,394 B2 * | 4/2016 | Byun | ........................ | G11C 7/22 |
| 9,740,556 B2 * | 8/2017 | Kim, II | ............... | G06F 11/1008 |
| 10,204,005 B2 * | 2/2019 | Cha | ........................ | G06F 11/08 |
| 2009/0024898 A1 * | 1/2009 | Richard | .............. | H03M 13/091 |
| | | | | 714/757 |
| 2010/0306618 A1 * | 12/2010 | Kim | ....................... | H04H 20/30 |
| | | | | 714/755 |

(Continued)

FOREIGN PATENT DOCUMENTS

KR 100825002 4/2008

*Primary Examiner* — John J Tabone, Jr.
(74) *Attorney, Agent, or Firm* — IP & T Group LLP

(57) ABSTRACT

A semiconductor device includes: a control signal generation unit configured to generate a second control signal having a cycle shorter than a first control signal in response to a clock signal and the first control signal; a cyclic redundancy check (CRC) control unit configured to perform a control to receive first and second data groups in response to the second control signal, and to output the first and second data groups with a time lag; and a CRC operation unit configured to perform a cyclic redundancy check on each of the first and second data groups sequentially output through the CRC control unit.

20 Claims, 3 Drawing Sheets

(56) References Cited

U.S. PATENT DOCUMENTS

| | | | |
|---|---|---|---|
| 2011/0047400 A1* | 2/2011 | Blackmon | G06F 11/141 |
| | | | 713/400 |
| 2015/0063044 A1* | 3/2015 | Byun | G11C 7/22 |
| | | | 365/193 |
| 2015/0227417 A1* | 8/2015 | Kim, II | G06F 11/1008 |
| | | | 714/764 |
| 2016/0253228 A1* | 9/2016 | Cha | G06F 11/08 |
| | | | 714/819 |
| 2018/0083764 A1* | 3/2018 | Dhakshinamurthy | |
| | | | H04L 7/0012 |

* cited by examiner

SEMICONDUCTOR DEVICE AND OPERATING METHOD THEREOF

CROSS-REFERENCE TO RELATED APPLICATIONS

The present application claims priority of Korean Patent Application No. 10-2016-0169218, filed on Dec. 13, 2016, which is incorporated herein by reference in its entirety.

BACKGROUND

1. Field

Exemplary embodiments of the present invention relate to a semiconductor design technology, and more particularly, to a semiconductor device having a cyclic redundancy check (CRC) function.

2. Description of the Related Art

In a system including a plurality of s miconductor devices, a semiconductor memory device is used to store data. When a data processing device e.g. a central processing unit (CPU), transmits a data request, the semiconductor memory device outputs data corresponding to an address received from the data processing device, which transmitted the data request, or stores data provided from the data processing device in a position corresponding to the address. As the operating speed of a system configured with a plurality of semiconductor devices increases and the semiconductor integrated circuit technologies advance the semiconductor memory devices are required to output and store data at a higher speed. In order for a semiconductor memory device to stably operate at a higher speed, a plurality of circuits inside the semiconductor memory device must operate at a high speed and to transfer signals or data between the circuits at a high speed. Fast operation of the semiconductor memory device can be achieved by executing a plurality of internal operations at higher speed or by increasing signal and data input/output speeds. For example, a double data rate (DDR) dynamic random access memory (DRAM) can input/output two pieces of data during one cycle, as well as inputting/outputting data at the rising edge of a system clock, in order to increase the output speed of data, so that the DDR DRAM has a higher data input/output speed than the conventional semiconductor memory device. Recently, in order to achieve a faster operation, a semiconductor memory device capable of inputting/outputting four pieces of data during one cycle of a system clock has been proposed.

If there is no physical damage inside a system, a data transfer error is generated generally by the mismatching of operation timing between a data transmitting side and a data receiving side. Since an operation margin is sufficient when data is transferred between a normal semiconductor memory device and a data processing device operating in synchronization with a lo frequency system clock data reliability is not greatly doubtful. However, when a data processing device and semiconductor memory device operate in synchronization with a hiqh-frequency system clock, the reliability of transferred data may be greatly degraded because the operation margin for data transfer may not be sufficient. In addition, as the operating speed of the semiconductor memory device increases and four pieces of data are input/output during one cycle of a system clock, a separate apparatus and method has been additionally required for ensuring the reliability as to whether the data transfer is exactly achieved. As one approach to this end, a recently proposed semiconductor memory device includes a separate pin to output an error detection code (EDC). The output of the EDC aims at detecting an error in data transferred in the read or write operation.

In order to ensure the reliability of data transfer, a recently proposed semiconductor memory device outputs cyclic redundancy check (CRC) data through an EDC pin. When the semiconductor memory device outputs CRC data a data processing device receives the CRC data and determines based on the CRC data whether an error occurs. The cyclic redundancy check (CRC) is a type of error detection methods for verifying the reliability of data, ensures a high reliability, requires a small overhead for error detection and has an excellent performance in the detection of a random error or burst error.

Generally, such a cyclic redundancy check (CRC) can be applied to a semiconductor device having eight bit lines BL8 through one CRC operator. A semiconductor device using a normal CRC operator as described above can receive nine pieces of data from each of eight bit lines, perform a check on 72 pieces of data, and filially output a total of eight pieces of CRC data. When a CRC operator having such a configuration is applied to a semiconductor device using 16 bit lines BL16, twice the amount of data than when using the conventional eight bit lines BL8 must be processed, so that two CRC operators must be used. Accordingly, area consumption increases, and thus a chip size also increases.

SUMMARY

Various embodiments are directed to provide a semiconductor memory device which can reduce area consumption when performing a cyclic redundancy check (CRC).

In an embodiment, a semiconductor device includes: a control signal generation unit configured to generate a second control signal having a cycle shorter than a first control signal in response to a clock signal and the first control signal; a cyclic redundancy check (CRC) control unit configured to perform a control to receive first and second data groups in response to the second control signal, and to output the first and second data groups with a time lag; and a CRC operation unit configured to perform a cyclic redundancy check on each of the first and second data groups sequentially output through the CRC control unit.

The CRC control unit may include: a first latch unit configured to latch the first data group in response to the second control signal; a second latch unit configured to latch the second data group in response to the second control signal; a third latch unit configured to latch the second data group, which has been latched by the second latch unit, in response to the second control signal; a clock dividing unit configured to generate a divided control signal by dividing the second control signal; and a selection unit configured to sequentially output the first data group latched by the first latch unit and the second data group latched by the third latch unit in response to the divided control signal.

The second data group latched by the third latch unit may be delayed by a predetermined time than the first data group.

The selection unit may be configured to sequentially output the first data group latched by the first latch unit and the second data group latched by the third latch unit according to whether the divided control signal is activated.

The first control signal may have a first cycle, and the second control signal may have a second cycle shorter than the first cycle, The CRC control unit may be configured to receive the first and second data groups during the first cycle, and the CRC control unit is configured to output the first and second data groups during the second cycle in response to the divided control signal.

The CRC operation unit may be configured to sequentially output first and second cyclic redundancy check data, by performing cyclic redundancy checks on the first and second data groups, in response to the divided control signal.

The clock signal and the first control signal may be received from an exterior.

The CRC control unit may be configured to receive the first and second data groups through data lines, The data lines may include global input/output lines.

The CRC operation unit may be configured to perform the cyclic redundancy check on data of eight bit lines at once.

In an embodiment, an operating method of a semiconductor device includes: receiving a first control signal and a clock signal; generating a second control signal having a shorter cycle than the first control signal; sequentially outputting a first data group and a second data group in response to the second control signal; and performing cyclic redundancy checks on the first data group and the second data group in regular sequence.

The sequentially outputting of the first data group and the second data group may include: delaying the second data group by a predetermined time than the first data group in response to the second control signal; generating a divided control signal by dividing the second control signal; and sequentially outputting the first data group and the second data group in response to the divided control signal.

The sequentially outputting of the first data group and the second data group may include: outputting the first data group when the divided control signal is activated; and outputting the delayed second data group when the divided control signal is inactivated after the activation.

The first control signal may have a first cycle, and the second control signal may have a second cycle shorter than the first cycle.

The performing of cyclic redundancy checks on the first data group and the second data group may include performing the cyclic redundancy checks on the first data group and the second data group at an interval of the second cycle.

The performing of cyclic redundancy checks on the first data group and the second data group may include: performing the cyclic redundancy check on the first data group when the divided signal is activated after a first data reception period and performing the cyclic redundancy check on the second data group when the divided signal is inactivated after a second data reception period.

Each of the first and second data reception periods may be equal to the first cycle, and the second data reception period may be activated later by an interval of the second cycle than the first data reception period.

The first data group and the second data group may be received through data input/output lines.

The data input/output lines may include global input/output lines.

DETAILED DESCRIPTION

Figure 1:
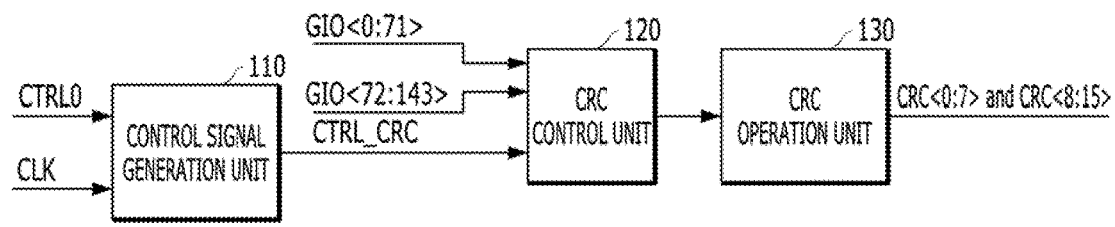
FIG. 1 is a block diagram illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The terminology used herein is for the purpose of describing particular embodiments only and is not intended to be limiting of the inventive concept. As used herein, singular forms are intended to include the plural forms as well, unless the context clearly indicates otherwise. It will be further understood that the terms "comprises," "comprising," "includes," and/or "including" when used in this specification, indicate the presence of stated features, but do not preclude the presence or addition of one or more other features. As used herein, the term "and/or" indicates any and all combinations of one or more of the associated listed items.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used in combination with other elements of another embodiment, unless specifically indicated otherwise.

Hereinafter, the various embodiments of the present invention will be described in detail with reference to the attached drawings. FIG. 1 is a block diagram illustrating a semiconductor device in accordance with an embodiment of the present invention.

Referring to FIG. 1, the semiconductor device may include a control signal generation unit 110, a cyclic redundancy check (CRC) control unit 120, and a CRC operation unit 130.

The control signal generation unit 110 may receive a first control signal CTRL0 and a clock signal CLK from the outside, and generate a second control signal CTRL_CRC having an interval which is different from that of the first control signal CTRL0. For example, the interval of the first control signal CTRL0 may be four cycles(4tCK) of the clock signal CLK, and the interval of the second control signal CTRL_CRC may be two cycles(2tCK) of the clock signal CLK.

The CRC control unit 120 may receive a first data group GIO<0:71> and a second data group GIO<72:143> in response to the second control signal CTRL_CRC. The first data group GIO<0:71> may be data received through first to 72$^{nd}$ global input/output lines, and the second data group GIO<72:143> may be data received through 73$^{rd}$ to 144$^{th}$ global input/output lines.

Since a general CRC operator receives nine pieces of data through each of eight bit lines, the general CRC operator may be connected to a total of 72 global input/output lines. In contrast, since the semiconductor device in accordance with an embodiment of the present invention is configured to receive 144 pieces of data, twice as many as 72 pieces of data, through time division, the CRC control unit 120 may first receive the first data group GIO<0:71>, and then, with time lag, receive the second data group GIO<72:143>.

The CRC control unit 120 may delay the second data group GIO<72:143> compared to the first data group GIO<0:71> by 1tCK with respect to the second control signal CTRL_CRC through an internal delay operation. Then, the CRC control unit 120 may sequentially output the first data group GIO<0:71> and the second data group GIO<72:143> with a time lag through a multiplexing (MUX) operation (or a selection operation).

The detailed configuration and operation of the CRC control unit 120 will be described with reference to FIG. 2.

The CRC operation unit 130 may sequentially receive the first and second data groups GIO<0:71> and GIO<72:143> output from the CRC control unit 120. Then, the CRC operation unit 130 may check errors in >each of the first and second data groups GIO<0:71> and GIO<72:143> and sequentially output cyclic redundancy check data CRC<0.7> and CRC<8:15> as a result thereof.

In this case, the CRC operation unit 130 may output the first cyclic redundancy check data CRC<0:7> by checking errors of the first data group GIO<0:71>, and then output the second cyclic redundancy check data CRC<8:15>by checking errors of the second data group GIO<72:143>. The output cyclic redundancy check data CRC<0:7>and CRC<8: 15> may be transferred and controlled through a data pad (not shown).

Since the CRC operation unit 130 can perform a cyclic redundancy check on data inputted through eight bit lines at once, the CRC operation unit 130 can perform a cyclic redundancy check on the first and second data groups GIO<0:71> and GIO<72:143> with a time lag. Meanwhile, differently from a conventional method in which a cyclic redundancy check is performed once during 4tCK, the CRC operation unit 130 may allocate a time of 2tCK to perform a cyclic redundancy check once. This is only one embodiment, and the time may be set by a person skilled in the art. Therefore, through the use of one CRC operation unit, the cyclic redundancy check can be performed on data twice as much compared to the conventional art, thereby reducing the area required for the CRC operation.

Figure 2:
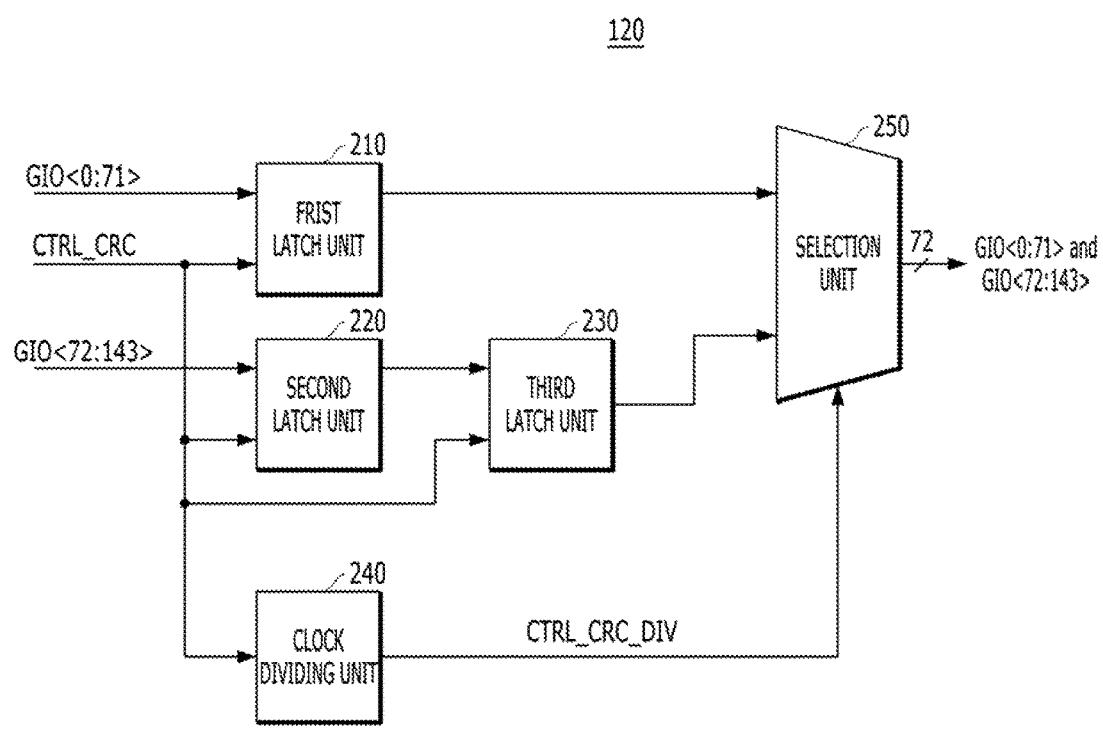
FIG. 2 is a block diagram illustrating an exemplary cyclic redundancy check (CRC) control unit shown in FIG. 1.

FIG. 2 is a block diagram illustrating a cyclic redundancy check (CRC) control unit, for example, the CRC control unit 120 shown in FIG. 1, in accordance with an embodiment of the present invention.

Referring to FIG. 2, the CRC control unit 120 may include first to third latch units 210, 220 and 230, a clock dividing unit 240, and a selection unit 250.

The first latch unit 210 may latch the first data group GIO<0:71> in response to the second control signal CTRL_CRC. The second latch unit 220 may latch the second data group GIO<72:143> in response to the second control signal CTRL_CRC. The third latch unit 230 may latch the second data group GIO<72:143>, which has been latched by the second latch unit 220, once more in response to the second control signal CTRL_CRC. Therefore, the second data group GIO<72:143> may be latched for a time period longer than the first data group GIO<0:71>. For example, the second data group GIO<72:143> may be outputted after a delay of 1tCK with respect to the second control signal CTRL_CRC In an embodiment the first to third latch units 210, 220 and 230 may be configured with flip-flops.

The clock dividing unit 240 may divide the second control signal CTRL_CRC to generate a divided control signal CTRL_CRC_DIV having a cycle twice as long as that of the second control signal CTRL_CRC.

For example, when the cycle of the second control signal CTRL_CRC is 2tCK, the cycle of the divided control signal CTRL_CRC_DIV may be 4tCK.

The selection unit 250 may sequentially output the first data group GIO<0:71> and the second data group GIO<72: 143> delayed by 1tCK with respect to the second control signal CTRL_CRC, in response to the divided control signal CTRL_CRC_DIV.

The selection unit 250 may output the delayed first data group GIO<0:71> when the divided control signal CTRL_CRC_DIV is activated at a high level, and may output the delayed second data group GIO<72:143> when the divided control signal CTRL_CRC_DIV is inactivated at a low level. Consequently, the selection unit 250 may output the first data group GIO<0:71> and then output the second data group GIO<72:143> in regular sequence.

Hereinafter, the operation of the semiconductor device including the CRC control unit 120 in accordance with an embodiment of the present invention will be described with reference to FIG. 3.

Figure 3:
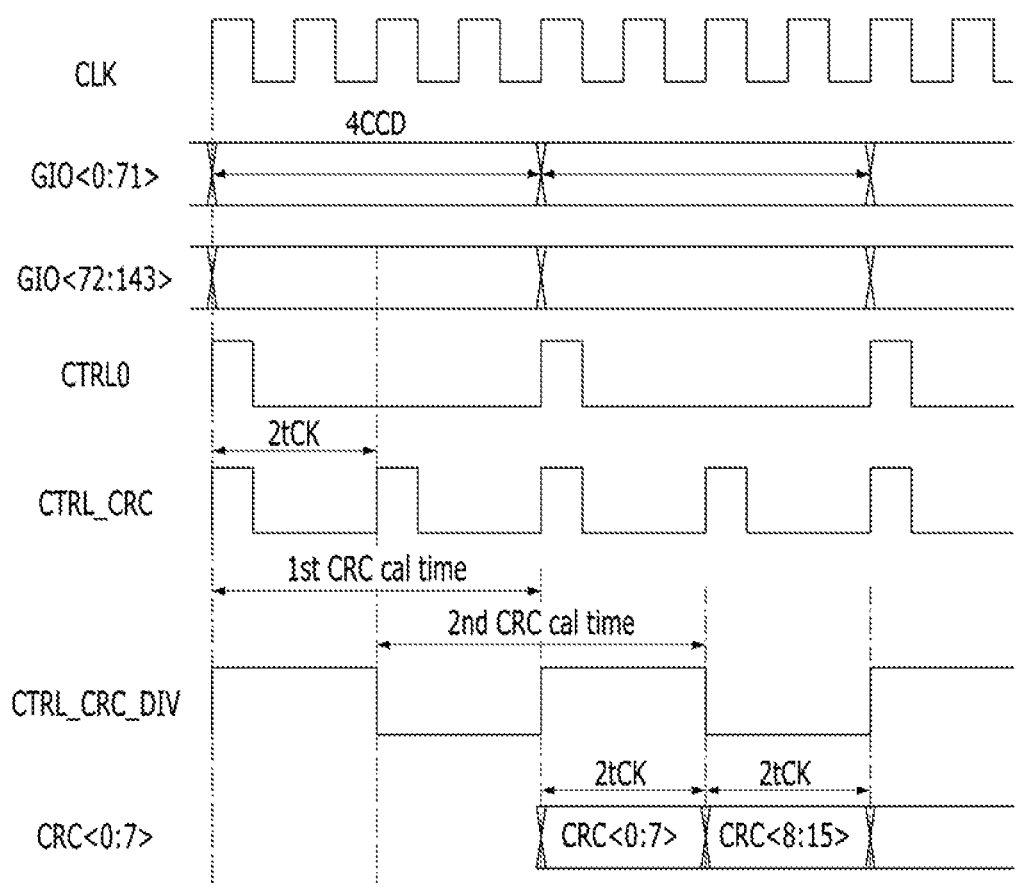
FIG. 3 is a timing diagram illustrating an exemplary operation of a semiconductor device shown in FIG. 1.

FIG. 3 is a timing diagram illustrating an operation of a semiconductor device, for example, the operation of the semiconductor device shown in FIG. 1, in accordance with an embodiment of the present invention.

Referring to FIG. 3, the semiconductor device may first generate a first control signal CTRL0 and a second control signal CTRL_CRC in response to a clock signal CLK received from the outside through the control signal generation unit 110 of FIG. 1. Here, the first control signal CTRL0 may be a signal activated once every 4tCK with respect to the clock signal CLK. The second control signal CTRL_CRC may be a signal activated one every 2tCK.

Thereafter, the first data group GIO<0:71> and the second data group GIO<72:143> may be received through the CRC control unit 120 in response to the second control signal CTRL_CRC. The received first data group GIO<0:71> and second data group GIO<72:143> may be output in response to the divided control signal CTRL_CRC_DIV (not shown). In more detail, the first data group GIO<0:71> may be received in response to activation of the second control signal CTRL_CRC, and the second data group GIO<72:143> may be received after a delay of 1tCK with respect to the second control signal CTRL_CRC, i.e. after a delay of 2tCK with respect to the clock signal CLK. In other words, the first data group GIO<0:71> may be received during a first data reception period "$1^{st}$ CRC cal time", and the second data group GIO<72:143> may be received during a second data reception period "$2^{nd}$ CRC cal time".

The clock dividing unit 240 may output a divided control signal CTRL_CRC_DIV having a cycle longer than that of the second control signal CTRL_CRC by dividing the second control signal CTRL_CRC. That is to say, the divided control signal CTRL_CRC_DIV may be a signal having a cycle of 4tCK with respect to the clock signal CLK.

The divided control signal CTRL_CRC_DIV may be received as a control signal of the selection unit 250. The selection unit 250 may sequentially output the first data group GIO<0:71> and the second data group GIO<72:143> in response to the divided control signal CTRL_CRC_DIV (not shown). For example, the selection unit 250 may output the first data group GIO<0:71> when the divided control signal CTRL_CRC_DIV is activated at a high level, and may output the second data group GIO<72:143> when the divided control signal CTRL_CRC_DIV is inactivated at a low level.

Therefore, the CRC operation unit 130 may check errors in each of the first and second data groups GIO<0:71> and GIO<72:143> received in regular sequence. Then, the CRC operation unit 130 may sequentially output cyclic redundancy check data CRC<0:7> and CRC<8:15> as a result thereof. In more detail, the CRC operation unit 130 may output the first cyclic redundancy check data CRC<0:7> of the cyclic redundancy check data CRC<0:7> and CRC<8:15> when the divided clock signal CTRL_CRC_DIV is activated at a high level after termination of the first data reception period "$1^{st}$ CRC cal time", and may output the second cyclic redundancy check data CRC<8:15> when the divided clock signal CTRL_CRC_DIV is inactivated at a low level after termination of the second data reception period "$2^{nd}$ CRC cal time".

In summary, the semiconductor device in accordance with an embodiment of the present invention can perform a CRC operation processing on twice the amount of data with respect to the same time period. In more detail, in the conventional method, a cyclic redundancy check is performed once during 4tCK, and one CRC operation unit can process nine pieces of input data through each of eight bit lines, i.e. a total of 72 pieces of data, when performing the cyclic redundancy check once. Therefore when data of 16 bit lines is processed, two CRC operation units are required, and thus a required area increases.

In contrast, according to the semiconductor device in accordance with an embodiment of the present invention, when data, i.e., 144 pieces of data, inputted through 16 bit lines is processed through one CRC operation unit, it is possible to time-divide a control signal CTRL0, to set 72 pieces of data as one group, and to control the cyclic redundancy check to be sequentially performed on two data groups with a time lag. Therefore, the semiconductor device in accordance with an embodiment of the present invention can reduce the required area to half of the conventional required area when performing the cyclic redundancy check on data.

According to the semiconductor memory device in accordance with an embodiment of the present invention, a control is performed to process data of 16 bit lines using one cyclic redundancy check (CRC) operator capable of processing data of eight bit lines, so that area consumption can be reduced.

Although various embodiments have been described for illustrative purposes, it will be apparent to those skilled in the art that various other changes and modifications may be made without departing from the spirit and scope of the invention as defined in the following claims.

What is claimed is:

1. A semiconductor device comprising:
   a control signal generation unit configured to generate a second control signal having a cycle shorter than a first control signal in response to a clock signal and the first control signal;
   a cyclic redundancy check (CRC) control unit configured to perform a control to receive first and second data groups in response to the second control signal, and to output the first and second data groups with a time lag; and
   a CRC operation unit configured to perform a cyclic redundancy check on each of the first and second data groups sequentially output through the CRC control unit.

2. The semiconductor device of claim wherein the CRC control unit comprises:
   a first latch unit configured to latch the first data group in response to the second control signal;
   a second latch unit configured to latch the second data group in response to the second control signal;
   a third latch unit configured to latch the second data group, which has been latched by the second latch unit, in response to the second control signal;
   a clock dividing unit configured to generate a divided control signal by dividing the second control signal; and
   a selection unit configured to sequentially output the first data group latched by the first latch unit and the second data group latched by the third latch unit in response to the divided control signal.

3. The semiconductor device of claim 2, wherein the second data group latched by the third latch unit is delayed by a predetermined time than the first data group.

4. The semiconductor device of claim 2, wherein the selection unit is configured to sequentially output the first data group latched by the first latch unit and the second data group latched by the third latch unit according to whether the divided control signal is activated.

5. The semiconductor device of claim 2, wherein the CRC operation unit is configured to sequentially output first and second cyclic redundancy check data, by performing cyclic redundancy checks on the first and second data groups, in response to the divided control signal.

6. The semiconductor device of claim 1, wherein the first control signal has a first cycle, and the second control signal has a second cycle shorter than the first cycle.

7. The semiconductor device of claim 6, wherein the CRC control unit is configured to receive the first and second data groups during the first cycle, and the CRC control unit is configured to output the first and second data groups during the second cycle in response to the divided control signal.

8. The semiconductor device of claim 1, wherein the clock signal and the first control signal are received from an exterior.

9. The semiconductor device of claim 1, wherein the CRC control unit is configured to receive the first and second data groups through data lines.

10. The semiconductor device of claim 9, herein the data lines comprise global input/output lines.

11. The semiconductor device of claim 1, wherein the CRC operation unit is configured to perform the cyclic redundancy check on data of eight bit lines at once.

12. An operating method of a semiconductor device, the method comprising:
  receiving a first control signal and a clock signal;
  generating a second control signal having a shorter cycle than the first control signal;
  sequentially outputting a first data group and second data group in response to the second control signal; and
  performing cyclic redundancy checks on the first data group and the second data group in regular sequence.

13. The method of claim 12, wherein the sequentially outputting of the first data group and the second data group comprises:
  delaying the second data group by a predetermined time than the first data group in response to the second control signal;
  generating a divided control signal by dividing the second control signal; and
  sequentially outputting the first data group and the second data group in response to the divided control signal.

14. The method of claim 13, wherein the sequentially outputting of the first data group and the second data group comprises:
  outputting the first data group when the divided control signal is activated; and
  outputting the delayed second data group when the divided control signal is inactivated after the activation.

15. The method of claim 12, wherein the first control signal has a first cycle, and the second control signal has a second cycle shorter than the first cycle.

16. The method of claim 12, wherein the performing of cyclic redundancy checks on the first data group and the second data group comprises performing the cyclic redundancy checks on the first data group and the second data group at an interval of the second cycle.

17. The method of claim 16, wherein the performing of cyclic redundancy checks on the first data group and the second data group comprises:
  performing the cyclic redundancy check on the first data group when the divided signal is activated after a first data reception period, and
  performing the cyclic redundancy check on the second data group when the divided signal is inactivated after a second data reception period.

18. The method of claim 17, wherein each of the first and second data reception periods is equal to the first cycle, and the second data reception period is activated later by an interval of the second cycle than the first data reception period.

19. The method of claim 12, wherein the first data group and the second data group are received through data input/output lines.

20. The method of claim 19, wherein the data input/output lines comprise global input/output lines.

* * * * *